Figure 1:
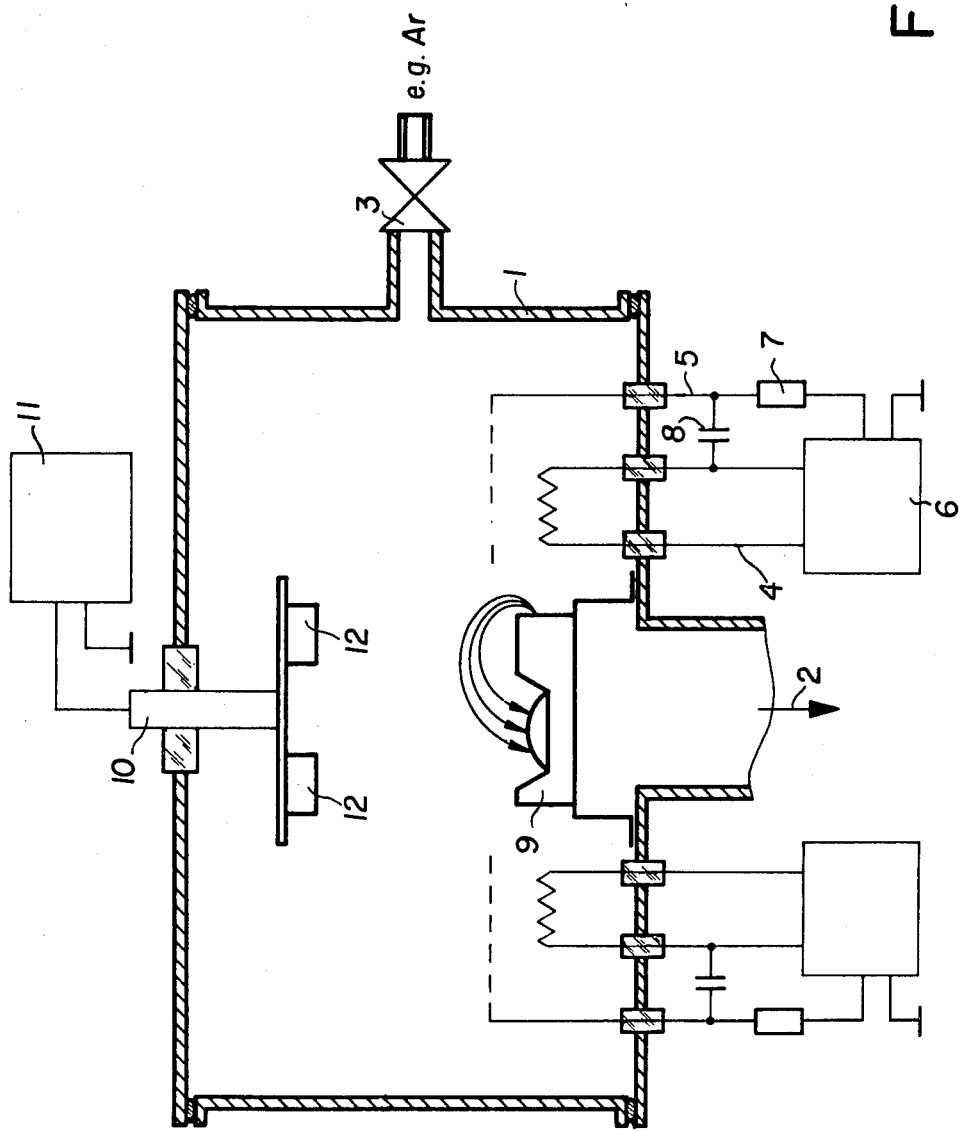

United States Patent [19]

Bollinger et al.

[11] 4,419,380

[45] Dec. 6, 1983

[54] METHOD FOR ION-AIDED COATING ON ELECTRICALLY INSULATING SUBSTRATES

[75] Inventors: Helmut Bollinger; Bernd Bücken; Dietmar Schulze; Rüdiger Wilberg, all of Dresden, German Democratic Rep.

[73] Assignee: VEB Hochvakuum Dresden, Dresden, German Democratic Rep.

[21] Appl. No.: 317,817

[22] Filed: Nov. 3, 1981

[30] Foreign Application Priority Data

Dec. 4, 1980 [DD] German Democratic Rep. ... 225718

[51] Int. Cl.³ ............................................. B05D 1/00
[52] U.S. Cl. .................................... 427/38; 427/39; 427/40; 427/41
[58] Field of Search .................. 427/38, 39, 40, 41

[56] References Cited

U.S. PATENT DOCUMENTS 4,349,582  9/1982  Beerwald et al. .................... 427/38

Primary Examiner—James R. Hoffman
Attorney, Agent, or Firm—Jordan and Hamburg

[57] ABSTRACT

The present invention is directed to coating low-conductive or non-conductive materials in a vacuum, such as coating electrically-insulating substrates, by operating a plasma source comprising a thermionic cathode and anode with the anode-voltage continuously alternating between an ignition voltage $U_Z$ and an extinction voltage $U_L$ at a frequency of between several kHz and several hundred kHz, the thermionic cathode continuously emitting electrons.

1 Claim, 2 Drawing Figures

METHOD FOR ION-AIDED COATING ON ELECTRICALLY INSULATING SUBSTRATES

SCOPE OF THE INVENTION

This invention deals with method and device by means of which particularly electrically non-conductive materials or such of low conductivity only can be coated under vacuum conditions by the action of ions. The benefits of ion-aided coating electrically conducting substrates, above all the good adhesive strength of the film on the carrier material, can be obtained even on electrically insulating substrates.

CHARACTERIZATION OF KNOWN METHODS

Well known is that electrically insulating substrates can be coated by ion-aided vacuum processes. Electrically charged particles of a plasma being maintained effective by rare and/or reaction gas are ionizing particles of the coating material which are accelerated towards the negatively biased substrate and deposited on it. With increasing coating duration, the insulating substrates get a positive charge since the charges of the arriving ions cannot be drained so that the ion injection and the effects advantageous for film adhesion and initiated by it on the substrate surface, cannot become effective.

Such disadvantages are avoided by an electron source arranged round about the substrates (DWP 74 998). Since the surface is exposed to continuous electron bombardment, the charges are neutralized which have been generated by ions of the coating material and reaction plasma. An unimpeded bombardment of the surface of the electrically insulating substrates can be guaranteed provided the electron sources are appropriately dimensioned. It is, however, necessary that the construction of the electron sources in any case fits the substrates which involves an additional and considerable expense.

Furthermore, any changes in process performance which frequently may become necessary for technically complex processes, will require to fit repeatedly the electron emission to the flow of ions. Intensive controls have to be provided to attain the useful operation of the device without troubles.

It is furthermore known for a rather long time to eliminate the electrical charge of insulating substrates for ion-aided coating techniques by the application of an HF a.c. voltage. This method, frequently used in sputtering technique, makes sure the drainage of the charges so that a reliable coating process will be guaranteed. However, provision is to be made for rather expensive apparatuses because additionally to an efficient high-frequency generator, adapters and supply elements to the substrates are required which have most different dielectric values and geometric dimensions.

OBJECT OF THE INVENTION

Object of the invention is to perform ion-aided coating by a technically simple engineering process and to avoid the use of expensive apparatuses.

PROBLEM AND SOLUTION OF THE INVENTION

Problem of the invention is to provide a method and device which allow to reliably coat electrically insulating substrates by using the action of ions or plasma, maintaining the advantages of these engineering techniques and avoiding special adapters and supply elements to the substrates.

The problem is solved according to the invention by arranging in the anode-voltage supply line to an already known plasma source, comprising thermionic cathode and positive anode grid, a series resistor, and between anode and cathode a capacitor the capacities of them being determined by the given operating pressure inside the vessel. The plasma source can be of concentric as well as of plane construction the latter type allowing, depending on the process to be performed, the installation of more than one plasma source.

The process is peculiar in that the plasma source necessary for ion-aided coating is alternatively operated in continuous order, the states of ionization and neutralization of the charges built up on the substrates being alternating, while the electron emission of the thermionic cathode is kept steady. Self-sustained discharge, i.e. relatively high gas pressure of about 1 ... 10 Pa, supplies the cathode with electrons required for the neutralization of the positive charge built-up on the substrates in the period of interruption in plasma and thus in dion generation. Pressures below 1 Pa down to about $10^{-2}$ Pa, additionally serve for maintaining the discharging effect of the electrons, a so-called non-self-sustained gas discharge.

The operating frequency of the process, i.e. the continuous change of state, advantageously is within the range of some kHz and some hundreds of kHz and results from the selected ignition and extinction voltages of the discharge at a given discharge pressure in the vacuum chamber and the specified data of resistor and capacitor, viz.

$$f^{-1} = R \cdot C \cdot l_n (U_O - U_L)/(U_O - U_Z)$$

with $U_O$ being the maximum voltage available at the plasma source.

The mode of action of the device according to the invention is as follows:

Having switched on the voltage supply for the plasma source the thermionic cathode is heated to emission temperature and, via the series resistor, the capacitor connected in parallel with the discharge circuit is charged. As soon as the ignition voltage $U_Z$ is attained, discharge is ignited. Since in this case the current flow via the discharging distance is higher than the charging current of the capacitor lowered by the series resistor, the capacitor is discharged, and the voltage at the anode falls to below the extinction voltage $U_L$ so that discharging in the vacuum chamber is interrupted. In this case, the capacitor will be charged again until discharging can be ignited again so that a so-called relaxation oscillation is attained. During the ignition phase of discharging, the positive ions generated by the discharge are accelerated towards the negatively biased substrate holder resulting in the charging of the electrically insulating substrates arranged on the holder. During the following extinction phase, these detrimental charges are eliminated by the electrons continuously emitted by the thermionic cathode. These electrons are accelerated by the anode voltage fallen, to below the extinction voltage but existing nevertheless, and they hit the substrates.

The coating material can be atomized or evaporated in the vessel or supplied in form of a gas into the vacuum chamber, in the plasma source it is appropriately dissociated by the action of ions and partly ionized, and deposited on the substrates as high-quality film. When more than one plasma source is installed, all available plasma sources can be operated in parallel as well as alternatively. But it is also possible that the plasma sources are operated simultaneously but at differing operation frequencies as well as in pulsating manner and at differing operating frequencies.

EMBODIMENTS OF THE INVENTION

Figure 2:
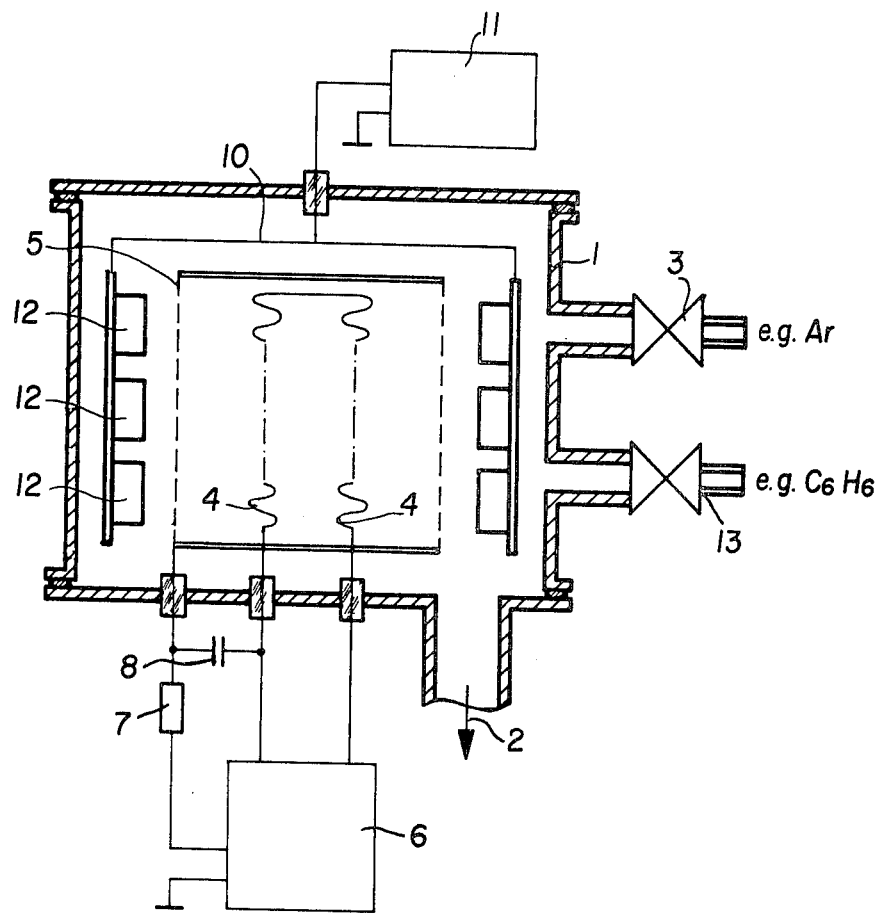

In order that the invention may be more fully understood, two embodiments shall now be described in detail where FIG. 1 is a variant of the device according to the invention with the electrodes arranged in plane level;

FIG. 2 is a concentrical arrangement of the device according to the invention to perform the method as to the invention.

FIG. 1 shows the vacuum chamber 1 together with the vacuumgenerating system 2 and the gas inlet system 3. Inside the vacuum chamber 1 the thermionic cathode 4, consisting of 0.3 mm tantalum wire, and the anode 5 cylindrically wound from 0.1 mm tungsten wire arranged in a distance of 100 mm to the thermionic cathode 4. The plasma source, consisting of thermionic cathode 4 and anode 5, is connected with the voltage supply unit 6. In the anode circuit a 100 ohms resistor 7 and parallel to the discharging distance a 47 µF capacitor 8 of sufficient voltage resistance are arranged.

In the vacuum chamber 1 there are furthermore arranged the coating device 9 and opposite to it the substrate holder 10 being connected with the voltage supply unit 11 supplying it with a sufficient amount of negative voltage.

The vacuum generating system 2, the gas inlet system 3, and the coating device 9 have been selected according to the application concerned. For realization of a more economic process this embodiment has been provided with a transversally arranged electron beam evaporator used as coating device 9.

By introducing argon, now an operating pressure of $10^{-2}$ Pa is obtained. The thermionic cathode 4 is supplied with a heating current of about 30 A, and the anode with a voltage of 250 V measured positively towards the anode. These operating parameters result in a sufficent emission of electrons with the electrons oscillating round about the grid-anode 5 ionizing so the working gas before they are accelerated towards the insulating substrates 12 fixed on the substrate holder 10 which have been charged by positive ions. The ion flow extracted from the plasma is 4 $Am^{-2}$ at $-800$ V applied accelerating voltage; the plasma current is 1.5 A, and the operating frequency 150 kHz.

FIG. 2 shows a coaxial arrangement which is particularly applied when gaseous coating material is used. In this case, the central thermionic cathode 4, consisting of 0.5 mm tungsten wire, is surrounded in a diatance of 150 mm by a grid-anode 5 made of 0.1 mm tungsten wire. The substrate holder 10, made of copper sheet, is arranged in a distance of 190 mm to the cathode 4.

The operating pressure has been set to 1 Pa, resulting in a plasma current of 0.8 A and an operating frequency of 320 kHz when the cathode heating current is 55 A and an accelerating voltage of $-600$ V is applied to the substrate holder 10. Resistor 7 has been set to 1,000 ohms and capacitor 8 to 100 nF. By introducing benzene via the feeding unit 13, under the mentioned conditions insulating substrates can be coated with hard and transparent carbon films.

What we claim is:

1. Method for ion-aided coating of electrically insulating substrates characterized in that the plasma source, consisting of thermionic cathode (4) and anode (5), is operated with the anode voltage continuously alternating between an ignition voltage $U_Z$ and an extinction voltage $U_L$ at a frequency of between several kHz and several hundred kHz, the thermionic cathode thereby continuously emitting electrons.

* * * * *